US011282670B1

(12) United States Patent
Potocek et al.

(10) Patent No.: US 11,282,670 B1
(45) Date of Patent: Mar. 22, 2022

(54) SLICE DEPTH RECONSTRUCTION OF CHARGED PARTICLE IMAGES USING MODEL SIMULATION FOR IMPROVED GENERATION OF 3D SAMPLE IMAGES

(71) Applicant: FEI Company, Hillsboro, OR (US)

(72) Inventors: Pavel Potocek, Eindhoven (NL); Lukáš Hübner, Brno (CZ); Miloš Hovorka, Brno (CZ); Erik Rene Kieft, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/136,431

(22) Filed: Dec. 29, 2020

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/244* (2013.01); *H01J 37/28* (2013.01); *H01J 2237/2007* (2013.01); *H01J 2237/221* (2013.01); *H01J 2237/226* (2013.01); *H01J 2237/2815* (2013.01)

(58) Field of Classification Search
CPC ........ H01J 37/222; H01J 37/244; H01J 37/28; H01J 2237/2815; H01J 2237/2007; H01J 2237/221; H01J 2237/226
See application file for complete search history.

(56) References Cited

U.S. PATENT DOCUMENTS

| | | | | |
|---|---|---|---|---|
| 6,453,063 | B1 * | 9/2002 | Phaneuf | G01N 23/2258 382/145 |
| 2012/0121160 | A1 * | 5/2012 | Matsuoka | G06T 7/001 382/145 |
| 2013/0228683 | A1 * | 9/2013 | Boughorbel | H01J 37/261 250/307 |
| 2016/0365224 | A1 * | 12/2016 | Potocek | H01J 37/3005 |
| 2018/0151326 | A1 * | 5/2018 | Kieft | H01J 37/045 |
| 2019/0348256 | A1 * | 11/2019 | Geurts | G06T 7/254 |
| 2020/0018944 | A1 * | 1/2020 | Fang | G06T 7/0002 |
| 2020/0025696 | A1 * | 1/2020 | Potocek | H01J 37/28 |
| 2020/0105500 | A1 * | 4/2020 | Chou | H01J 37/153 |
| 2020/0111219 | A1 * | 4/2020 | Potocek | G02B 21/367 |
| 2020/0243300 | A1 * | 7/2020 | Zeidler | H01J 37/263 |
| 2020/0286708 | A1 * | 9/2020 | Wang | H01L 27/14665 |
| 2020/0312611 | A1 * | 10/2020 | Potocek | G06T 11/006 |
| 2020/0357097 | A1 * | 11/2020 | Peemen | G06T 5/002 |
| 2021/0090846 | A1 * | 3/2021 | Liu | H01J 37/073 |
| 2021/0174491 | A1 * | 6/2021 | Pisarenco | G06T 7/70 |

* cited by examiner

*Primary Examiner* — David A Vanore

(57) ABSTRACT

Methods and systems include acquiring instances of data relating to multiple layers of a sample obtained via slice and view imaging where the electron interaction depth of the charged particle beam during each irradiation of the sample is larger than the thickness of the first layer and/or the thickness of the second layer. A simulated model is then accessed that identifies a plurality of yield values that identify expected portions/ratios of detected emissions that are expected to be generated by material in corresponding layers/depths of the sample. The yield values are used to segregate the instances of data into component portions based on the particular layer of the sample in which the structures expected to have generated the associated emissions are located. The component portions are then used to create reconstructions of individual layers and/or 3D reconstructions of the sample with reduced depth blur.

20 Claims, 8 Drawing Sheets

SLICE DEPTH RECONSTRUCTION OF CHARGED PARTICLE IMAGES USING MODEL SIMULATION FOR IMPROVED GENERATION OF 3D SAMPLE IMAGES

BACKGROUND OF THE INVENTION

Slice and view charged particle imaging is an essential tool for sample reconstruction and examination in biological research, semiconductor debugging, material science, as well as numerous other applications. In slice and view charged particle imaging, consecutive surface layers of a sample are iteratively imaged and then removed, and then the resultant images are combined to form a 3D reconstruction of the sample. For example, FIG. 1 illustrates a sample process 100 for conducting slice and view imaging on with a charged particle microscope. Specifically, FIG. 1 includes three images that depict iterative steps of the slice and view imaging process.

Image 102 shows SEM imaging of an $n^{th}$ layer of a sample 108. During the SEM imaging an electron beam 110 is scanned across the surface 108 of the $n^{th}$ layer of the sample 108, and a detector 112 detects emissions 114 resultant from the sample being irradiated by the electron beam. Image 104 then depicts the process of the $n^{th}$ layer of the sample 108 being removed and/or otherwise delayered. While Image 104 depicts the $n^{th}$ layer being removed with a focused ion beam 116, the $n^{th}$ layer may be removed using other mechanisms, such as an electron beam, a laser, a diamond blade, etc. As shown in image 106, the SEM imaging can then be repeated on the $n^{th}+1$ layer of the sample 108. The detected emissions 114 from images 102 and 106 are then used to generate an image of the $n^{th}$ layer of the sample 108 and the $n^{th}+1$ layer of the sample 108, respectively. As slice and view charged particle imaging acquires a series of cross-sectional images of a sample at various depths along the z-axis, the acquired images and/or the data they are generated from can be used to reconstruct a 3D representation of the sample.

However, a fundamental limitation of slice and view charged particle imaging is the increase in blurring of the 3D reconstruction along the z-axis of the sample (i.e., z-blur) that occurs as the thickness of the slice of sample removed is reduced below the electron interaction depth of the charged particle beam. The electron interaction depth corresponds to the perpendicular distance from the surface of the sample 108 to the further part of a region of the sample that the electrons/charged particles of the imaging beam interact with to cause the molecules/elements/features within the region of the sample to release emissions 114. For example, images 102 and 106 illustrate the electron interaction area 118 (i.e., the region of the sample that electrons introduced by the electron beam 110 interact with) as extending below the thickness of the $n^{th}$ and $n^{th}+1$ sample layer, respectively. As the detected emissions 114 contain information describing the electron interaction area 118 which they are resultant from, the images generated from such detected emissions include information from z-depths that are greater than the slice thickness. That is, even though the image is intended to depict the corresponding slice of the sample, when the electron interaction depth exceeds the thickness of the slice of sample removed then the image contains information from multiple slices. This phenomenon is what causes the aforementioned blurring of the 3D reconstruction along the z-axis.

To combat this, current practice is to reduce the voltage of the charged particle beam such that there is a smaller electron interaction area 120. While this reduces the depth of the electron interaction area, the reduced voltage of the charged particle beam causes a corresponding reduction in emissions 114 which in turn reduces the signal to noise ratio (SNR) of the signal obtained by the detector 112. Moreover, the reduction of the voltage of the charged particle beam also makes it harder for the beam to be shaped. This variation in beam shape causes a reduction in the x-y resolution of the 3D reconstruction. Accordingly, there is a need for a solution that allows for thinner slices of the sample to be removed (e.g., 2-5 nm or below) without decreasing the x-y resolution or the SNR.

SUMMARY

Methods and systems for generating simulation based reconstructions of 3D samples imaged using slice and view processes where the electron interaction depth of the imaging beam is greater than slice thicknesses, are disclosed. An example method includes acquiring first data relating to a first layer of a sample where the first data was acquired via a first irradiation of the first layer of the sample with a charged particle beam, and then acquiring second data relating to a second layer of a sample that has been acquired by irradiation of the second layer of the sample with the charged particle beam. Between the first irradiation and the second irradiation the first layer of the sample was removed. Additionally, the electron interaction depth of the charged particle beam during each irradiation of the sample is larger than the thickness of the first layer and/or the thickness of the second layer.

A simulated model is then accessed that identifies a plurality of yield values, where each yield value identifies an expected sensitivity of the detected emissions to variations in material composition (e.g., percentage of a dopant atom) in a corresponding layer/depth of the sample. For example, the first yield value can correspond to an expected sensitivity of the detected emissions to variations in material composition of within the surface layer of the sample (i.e., an expected sensitivity of the first data to variations in material composition in the first layer of the sample, and an expected sensitivity of the second data to variations in material composition in the second layer of the sample, a ratio of the image intensity variation over variation in material composition, ratio of image intensity increase relative to the background, over percentage of staining in the material, etc.). A first reconstruction of the first layer and a second reconstruction of the second layer are then determined based on the simulated model, the first data, and the second data. In some embodiments, a high-resolution 3D reconstruction of the sample with reduced depth blur is then generated using at least the first layer and the second layer. As discussed further below, methods according to the present disclosure may include a plurality of instances of additional data that were each acquired by irradiation of a corresponding layer of the sample with the charged particle beam during slice and view imaging.

Systems for generating high-resolution reconstructions of 3D samples imaged using slice and view processes where the electron interaction depth of the imaging beam is greater than slice thicknesses, comprise a sample holder configured to hold a sample, an electron beam source configured to emit an electron beam toward the sample, an electron beam column configured to direct the electron beam onto the sample, a delayering component configured to remove a layer from the surface of the sample, the layer having a known thickness, and one or more detectors configured to detect emissions resultant from the electron beam irradiating the sample. The systems further include one or more processors and a memory storing instructions that when executed on the one or more processors causes the system to acquire first data relating to a first layer of a sample and second data relating to a second layer of the sample via slice and view imagine, where the electron interaction depth of the imaging is larger than each of the thickness of the first layer and the thickness of the second layer, use a depth blur reducing algorithm to enhance the first data and the second data, and then generate a high-resolution 3D reconstruction of the sample using the enhanced data.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
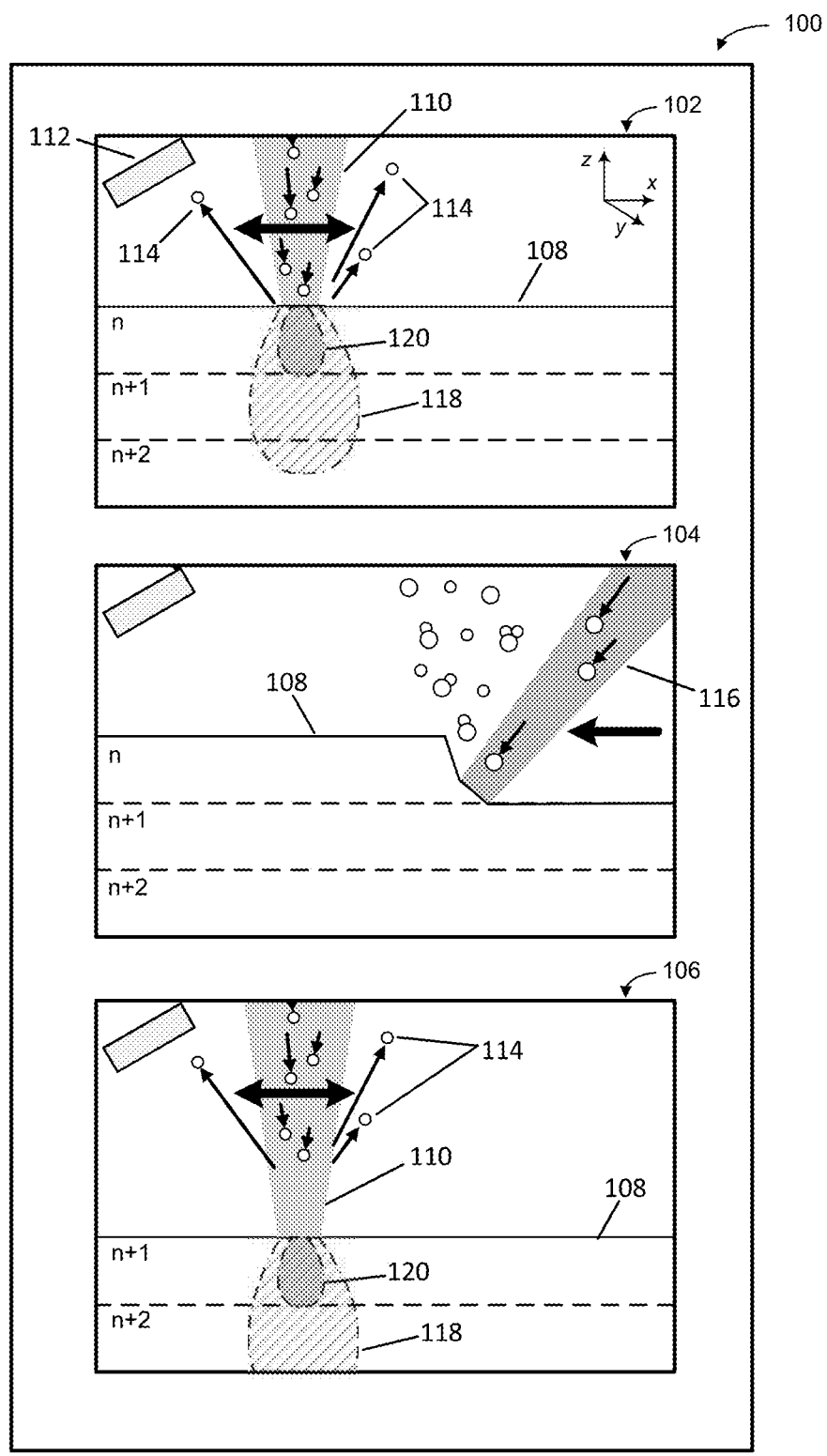
FIG. 1 illustrates a sample process for conducting slice and view imaging on with a charged particle microscope.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Methods and systems for generating simulation-based reconstructions of 3D samples imaged using slice and view processes where the electron interaction depth of the imaging beam is greater than slice thicknesses, are disclosed. Specifically, the methods and systems employ a simulated model that identifies a plurality of yield values. Each of the yield values corresponds to a sensitivity of the emissions detected during imaging of a sample to variations in material composition within a corresponding layer/depth of a sample.

By using the yield values, the methods and systems of the present disclosure are able to estimate how sensitive a resultant image and/or instance of image data is expected to be to the presence of structures at different layers/depths of a sample. Moreover, since a plurality of images/instances of image data are acquired during slice and view imaging, and since a layer of the sample is removed between the acquisition of different images, the methods and systems of the present disclosure are able to determine how sensitive each of the plurality of images/instances of image data is expected to have been to structures within a particular layer of the sample. Once the expected sensitivities are known across the plurality of images/instances of image data, the system is able to linearly combine each instance of data with one or more subsequent (i.e., acquired after one or more layers of the sample have be removed) instances of data, to eliminate from the resulting instance of data any contributions that correspond to deeper layers. From the resulting instances of data the methods and systems of the present disclosure are able to create reconstructions of individual layers of the sample. In some embodiments of the present disclosure, in addition to eliminating contributions from deeper layers, the system also compensates for the expected variation in blurring of contributions from different layers. For example, for layers at different depths (i.e., positions along the z-axis) the contributions have different rates of blurring (i.e., amount of blurring distortion of the corresponding data in the x and/or y direction). In such embodiments, system is able to use expected blurring coefficients for different depths to account for the blurring of data resulting from variations in the composition of different layers of the sample.

In this way, because each of the reconstructions are based on instances of data that each correspond to a single layer of the sample (i.e., instances of data where contributions from layers below the surface layer are removed), the depth blur resultant from the electron interaction depth of the imaging beam being greater than slice thicknesses is greatly reduced or eliminated. Because of this reduction and/or elimination of depth blur, the methods and systems of the present disclosure allow for high-resolution 3D reconstructions of samples to be obtained with slice and view processes without having to reduce the imaging beam energy so that the electron interaction depth is less than the layer thickness. Additionally, by enabling such slice and view processes to use higher energy beams, the SNR of the acquired data is improved, and the beam can be consistently shaped to allow for high-resolution data acquisition.

Figure 2:
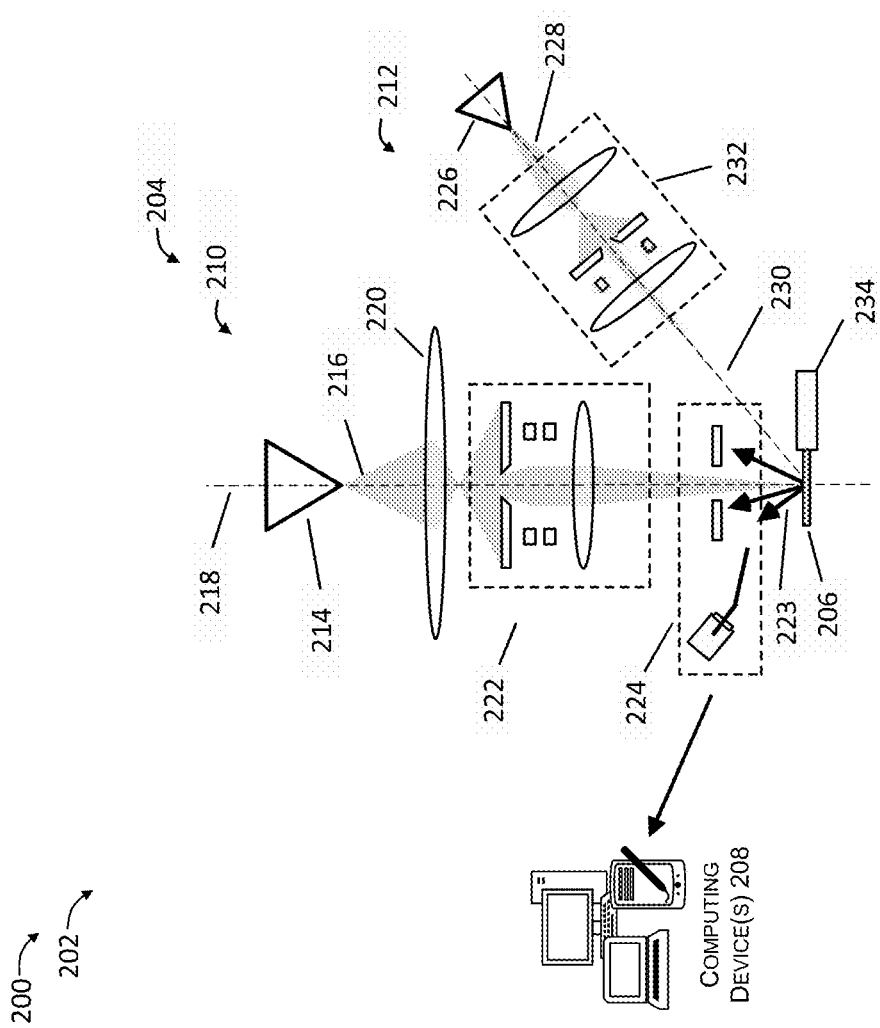
FIG. 2 depicts an environment for using one or more simulated models to generate high-resolution reconstructions of samples imaged using slice and view processes where the electron interaction depth of the imaging beam is greater than slice thicknesses.

FIG. 2 is an illustration of an environment 200 for using one or more simulated models to generate high-resolution reconstructions of samples imaged using slice and view processes where the electron interaction depth of the imaging beam is greater than slice thicknesses. Specifically, FIG. 2 shows an example environment 202 that includes an example microscope system(s) 204 for generating slice and view images of a sample 206 and one or more computing devices 208 for using, training, optimizing, and/or retraining depth blur reducing algorithms for generating high-resolution reconstructions of 3D samples imaged with reduced z-dimensional blur. It is noted that present disclosure is not limited to environments that include microscopes, and that in some embodiments the environments 200 may include a different type of system that is configured to generate correlated images, or may not include a system for generating images at all.

The example microscope system(s) 204 may be or include one or more different types of optical, and/or charged particle microscopes, such as, but not limited to, a scanning electron microscope (SEM), a scanning transmission electron microscope (STEM), a transmission electron microscope (TEM), a charged particle microscope (CPM), a cryo-compatible microscope, focused ion beam (FIB) microscope, dual beam microscopy system, or combinations thereof. FIG. 2 shows the example microscope system(s) 204 as being a dual beam microscopy system including a SEM column 210 and a FIB column 212.

FIG. 2 depicts the example microscope system(s) 204 as including SEM column 210 for imaging layers of the sample 206 during slice and view imaging. The SEM column 210 includes an electron source 214 (e.g., a thermal electron source, Schottky-emission source, field emission source, etc.) that emits an electron beam 216 along an electron emission axis 218 and towards the sample 206. The electron emission axis 218 is a central axis that runs along the length of the example microscope system(s) 204 from the electron source 214 and through the sample 206. While FIG. 2 depicts the example microscope system(s) 204 as including an electron source 204, in other embodiments the example microscope system(s) 204 may comprise a charged particle source, such as an ion source, configured to emit a plurality of charged particles toward the sample 206.

An accelerator lens 220 accelerates/decelerates, focuses, and/or directs the electron beam 216 towards an electron focusing column 222. The electron focusing column 222 focuses the electron beam 212 so that it is incident on at least a portion of the sample 206. Additionally, the focusing column 222 may correct and/or tune aberrations (e.g., geometric aberrations, chromatic aberrations) of the electron beam 216. In some embodiments, the electron focusing column 222 may include one or more of an aperture, deflectors, transfer lenses, scan coils, condenser lenses, objective lens, etc. that together focus electrons from electron source 214 onto a small spot on the sample 206. Different locations of the sample 206 may be scanned by adjusting the electron beam direction via the deflectors and/or scan coils. In this way, the electron beam 216 acts as an imaging beam that is scanned across a surface layer of the sample (i.e., the surface of the layer proximate the SEM column 204 and/or that is irradiated by the electron beam 216). This irradiation of the surface layer of the sample 206 causes the component electrons of the electron beam 216 to interact with component elements/molecules/features of the sample, such that component elements/molecules/features cause emissions 223 to be emitted by the sample 206. The specific emissions that are released are based on the corresponding elements/molecules/features that caused them to be emitted, such that the emissions can be analyzed to determine information about the corresponding elements/molecules.

While the electron beam 216 is incident on the surface layer of the sample 206 a portion of its component electrons penetrate the sample and interact with elements/molecules/features at different depths from the surface of the sample. An electron interaction depth of the electron beam 216 corresponds to the distance from the surface of the sample that includes 95% elements/molecules/features of the sample that electrons of the electron beam 216 interact with during the irradiation. In this way, the emissions 223 can be analyzed to determine information about elements/molecules that are present from the surface of the sample 206 to the electron interaction depth.

FIG. 2 further illustrates a detector system 224 for detecting emissions resultant from the electron beam 216 being incident on the sample 206. The detector system 224 may comprise one or more detectors positioned or otherwise configured to detect such emissions. In various embodiments, different detectors and/or different portions of single detectors may be configured to detect different types of emissions, or be configured such that different parameters of the emissions detected by the different detectors and/or different portions. The detector system 224 is further configured to generate a data/data signal corresponding to the detected emissions, and transmit the data/data signal to one or more computing devices 208.

While FIG. 2 depicts the example microscope system(s) 204 as including FIB column 212 for removing layers of the sample 206 during slice and view imaging, in other embodiments the example microscope system(s) 204 may include other types of delayering components, such as a laser, a mechanical blade (e.g., a diamond blade), an electron beam, etc. The FIB column 212 is shown as including a charged particle emitter 226 configured to emit a plurality of ions 228 along an ion emission axis 230.

The ion emission axis 230 is a central axis that runs from the charged particle emitter 226 and through the sample 206. The FIB column 212 further includes an ion focusing column 232 that comprises one or more of an aperture, deflectors, transfer lenses, scan coils, condenser lenses, objective lens, etc. that together focus ions from charged particle emitter 226 onto a small spot on the sample 206. In this way, the elements in the ion focusing column 232 may cause the ions emitted by the charged particle emitter 226 to mill away or otherwise remove one or more portions of the sample. For example, during slice and view imaging the FIB column 212 may be configured to cause a surface layer of the sample 206 having a known thickness to be removed from the sample 206 between image acquisitions.

FIG. 2 further illustrates the example microscope system(s) 204 as further including a sample holder 234. The sample holder 234 is configured to hold the sample 206, and can translate, rotate, and/or tilt the sample 102 in relation to the example microscope system(s) 204.

The environment 200 is also shown as including one or more computing device(s) 208. Those skilled in the art will appreciate that the computing devices 208 depicted in FIG. 2 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 208 may also be connected to other devices that are not illustrated, or instead may operate as a stand-alone system.

It is also noted that one or more of the computing device(s) 208 may be a component of the example microscope system(s) 204, may be a separate device from the example microscope system(s) 204 which is in communication with the example microscope system(s) 204 via a network communication interface, or a combination thereof. For example, an example microscope system(s) 204 may include a first computing device 208 that is a component portion of the example microscope system(s) 204, and which acts as a controller that drives the operation of the example charged particle microscope system(s) 204 (e.g., adjust the scanning location on the sample by operating the scan coils, etc.). In such an embodiment the example microscope system(s) 204 may also include a second computing device 208 that is desktop computer separate from the example microscope system(s) 204, and which is executable to process data received from the detector system 224 to generate images of the sample 206 and/or perform other types of analysis or post processing of detector data. The computing devices 208 may further be configured to receive user selections via a keyboard, mouse, touchpad, touchscreen, etc.

The computing device(s) 208 are configured to generate images of the surface layer of the sample 206 within the example microscope system(s) 204 based on data and/or the data signal from the detector system 224. Specifically, because the data and/or the data signal from the detector system 224 is based on the emissions 223 emitted from the sample 206 during irradiation of the surface of the sample, the data and/or the data signal can be analyzed to determine the makeup of the sample (i.e., component elements/molecules/features) between the surface of the sample and the electron interaction depth of the electron beam 216 such that an image of the surface layer of the sample can be generated. In some embodiments, the images are grayscale images that show contrasts indicative of the shape and/or the materials of the sample.

Moreover, since the FIB column 212 is able to remove a layer of the sample 206 having a known thickness, the computing device(s) 208 are able to determine the location of the sample 206 to which each image of the series of images corresponds. In this way, during the process of slice and view imaging, the computing device(s) 208 generate a series of images of layers of the sample at periodic depths. However, since the images contain information relating to elements/molecules/features between the surface and the electron interaction depth of the electron beam 216, when the thickness of the layer that the FIB column 212 removes is less than the electron interaction depth of the electron beam 216 the images generated by the computing devices 208 depict elements/molecules/features of the sample from multiple layers of the sample. For example, in embodiments where the FIB column 212 removes a 2 nm layer from the surface of the sample 206 and the electron interaction depth of the electron beam 216 is 10 nm, then each image generated by the computing devices 208 would depict elements/molecules/features of the sample from 5 different layers of the sample. Therefore, a 3D reconstruction of the sample 206 that is generated based on such images would have a blurring of the reconstruction due to individual elements/molecules/features being attributed to multiple layers of the sample, when in reality they are only present in one layer.

According to the present invention, the computing device(s) 208 are further configured to use one or more simulated models to generate high-resolution reconstructions of 3D samples using two or more of the images/instances of data captured during slice and view imaging of a sample. Specifically, the computing device(s) are configured to use the one or more simulated models to determine the estimated contributions of different layers of the sample to the images/instances of data captured during slice and view imaging of a sample. By determining the estimated contributions of the different layers, the computing device(s) 208 are then able to generate reconstructions of the individual sample layers using portions of data that are resultant from elements/molecules/features within that corresponding layer of the sample 206. Since the individual reconstructions contain a reduced amount and/or no data resultant from matter within other layers of the sample, when the reconstructions are used to create a 3D reconstruction of the sample, the depth blur traditionally caused by the electron interaction depth of the imaging beam being greater than slice thicknesses is greatly reduced and/or eliminated.

Figure 6:
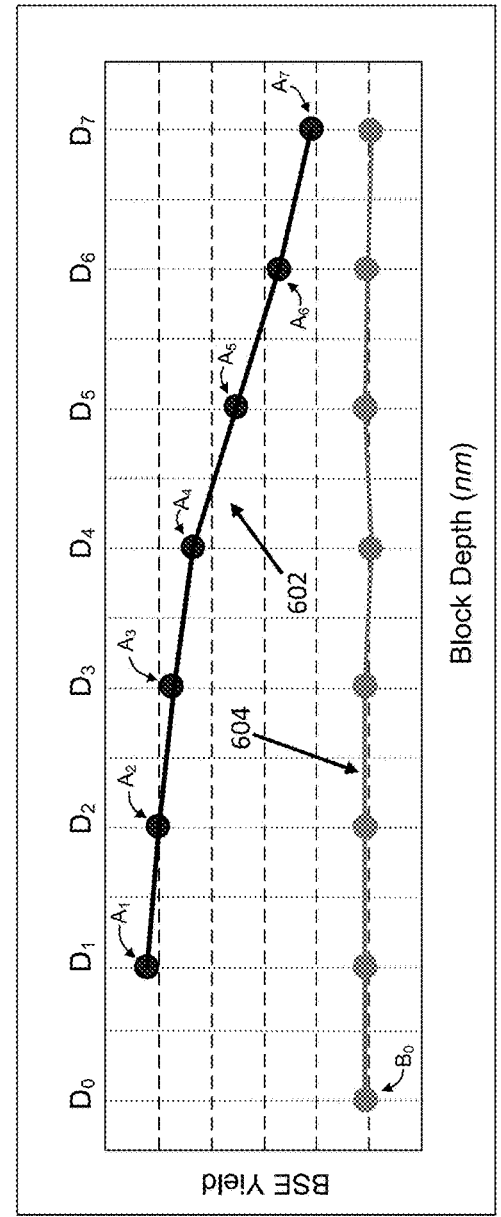
FIG. 6 shows an example of a simulated model that identifies a plurality of yield values for different depths/depth ranges.

The computing device(s) 208 are configured to access a simulated model that identifies a plurality of yield values. Individual yield values identify a sensitivity of the detected emissions resultant from irradiation of a sample to variations in material composition within a corresponding depth/depth range of the sample. For example, a simulated model may identify a first yield value that corresponds to the expected sensitivity of detected emissions to structures within the surface layer of the sample (i.e., a topmost layer of the sample having a certain depth). In some embodiments, an individual simulated model may identify a number of discrete yield values and the expected depth and/or depth range they are each associated with. Alternatively or in addition, an individual simulated model may identify a curve and/or other graphical relationship between the depth in the sample and corresponding yield value. An example of such a graphical relationship is illustrated in FIG. 6.

The simulated model is generated at least in part by a computationally simulated irradiation of a modeled sample that simulated the detection of emissions that were generated by structures at different depths of the sample. In some embodiments, the computationally simulated irradiation may be performed via a Monte Carlo simulation. For example, the computationally simulated irradiation may correspond to the simulation of an irradiation of the modeled sample, a simulation of emissions from structures at different depths of the sample resultant from the simulated irradiation, and the simulated detection of the simulated emissions. Alternatively, the computationally simulated irradiation of the modeled sample may simulate the amount of emissions detected by a detector system that were generated by structures at a particular depth/depth range of the modeled sample. Such a simulation can then be repeated for different depths/depth ranges within the sample. Based on the computationally simulated irradiation, a plurality of yield values and/or a graphical relationship that correspond to the expected sensitivities of the detected emissions resultant from irradiation of a sample to variations in structures at a corresponding depth/depth ranges of the sample.

In some embodiments, the computationally simulated irradiation of the model is conducted with a modeled sample having particular sample characteristics (e.g., component materials, densities, sample types, stain characteristics, geometry, protocol for generating the sample, etc.) and/or a charged particle beam having particular beam characteristics (e.g., beam type, beam voltage, landing energy, beam energy, spot size, dwell time, etc.). In this way, the yield values and/or graphical relationships determined from such a computationally simulated irradiation may be specifically tuned to images/instances of data obtained using slice and view imaging with similar sample and/or charged particle beam characteristics.

According to the present disclosure, the computing device(s) 208 are configured to use the yield values and/or graphical relationships to generate reconstructions of individual layers of the sample. Specifically, the computing devices(s) 208 are configured to use the yield values specified by the simulated model to linearly combine two or more images/instances of image data that are attributable to individual layers of the sample to generate one or more reconstructed instances of data. Each individual reconstructed instance of data correspond to a particular layer of the sample, where contributions based on structures/material variations from other layers (i.e., layers of the sample below the particular layer) have been removed. Because it is known how much of the sample 206 was removed between irradiations of the sample, the computing device(s) 208 is able to determine the depth/depth range of each layer of the sample when the irradiation corresponding to each image/instance of data occurred. Then, because the computing device(s) 208 knows the depth/depth range of an individual layer during each irradiation, the computing device(s) 208 may use the yield values specified by the simulated model to determine the sensitivities of each image/instance of image data to variations in structures within the various layers of the sample. Thus, the reconstructed instances of data each reflect the composition/structures within an individual layer of the sample.

In some embodiments, the computing devices 208 determine the portion/ratio of each image/instance of image data that is expected to have been generated by structures within the individual layer at least in part by solving the relationship:

$$N_i = B_0 + \begin{bmatrix} A_1 & A_2 & A_3 & \ldots & A_n \\ 0 & A_1 & A_2 & \ldots & A_{n-1} \\ 0 & 0 & A_1 & \ldots & A_{n-2} \\ \vdots & \vdots & \vdots & \ddots & \vdots \\ 0 & 0 & 0 & \ldots & A_1 \end{bmatrix} \cdot \begin{bmatrix} S_1 \\ S_2 \\ S_3 \\ S_4 \\ \vdots \\ S_n \end{bmatrix}. \quad (1)$$

where $N_i$ corresponds to the set of i instances of data generated during slice and view imaging of the sample, $A_n$ corresponds to the $n^{th}$ yield value of the simulated model, $S_n$ corresponds to the $n^{th}$ layer of the sample, and $B_0$ corresponds to the expected background noise generated by a charged particle system during irradiation of a sample. For example, the contribution of emissions for the topmost layer of the sample to the first image would be $A_1 \times S_1$, where $A_1$ is the yield value for a surface layer of a sample. Additionally, the contribution of emissions for the topmost layer of the sample would be 0 for the remaining instances of image as the topmost layer of the sample was removed following the first irradiation of the sample. Similarly, the contributions of the secondary layer (second layer from the top) to the plurality of instances of image data would be $A_2 \times S_2$ and $A_1 \times S_2$, where $A_2$ is the yield value for the layer below the surface layer of the sample.

It is noted that a person having skill in the art would understand that the invention of the present disclosure is not limited to the explicit relationships conveyed by formula (1), but rather formula (1) merely shows an example of how the yield values may be used to linearly combine pluralities of image data to generated simulated data corresponding to individual sample layers. For example, the example model represented by equation (1) is valid only for a situation when we have instances of data for exactly n layers of sample. A person having skill in the art would understand that this model may not be correct for a situation with a block specimen (i.e., a specimen for which the entirety of the sample is not removed during slice and view imaging), since the contribution from the remaining portions of the block below the last imaged layer cannot be considered to be always constant or zero. However, in such situations a model solution can be estimated with some level of approximation for the first layer, when we consider so many layers in order the contribution of $A_n$ s negligible to $A_1$.

Moreover, in some embodiments the computing devices 208 are further configured to account for blurring of information from individual layers. For example, the computing devices 208 may access a plurality of blurring coefficients that each identify the expected amount of blurring for emissions resultant from structures at a corresponding depth of the sample. That is, in addition to eliminating contributions from deeper layers, the computing devices 208 may use the blurring coefficients to also compensate for the expected variation in blurring of contributions from different layers of the sample. In this way, the computing devices 208 are able to account for the blurring of data resulting from variations in the composition of different layers of the sample. In some embodiments, the blurring coefficients are determined based on an assumed variation of the size of the x-y cross section of the electron interaction depth at different sample depths. For sample depths where the crossectional size is larger, the computing devices 208 apply a blurring coefficient that accounts for the additional 'bluring' of the expected individual contributions of material transitions at that sample depth. As the 'blur' effect depends on the depth, an example system of (non) linear equations that the computing devices 208 may use to account for this bluring is:

$N_1 = B_0 + A_1\sigma_1(S_1) + A_2\sigma_2(S_2) + A_3\sigma_3(S_3) + A_4\sigma_4(S_4) + A_5\sigma_5(S_5)A_6\sigma_6(S_6);$ $N_2 = B_0 + A_1\sigma_1(S_2) + A_2\sigma_2(S_3) + A_3\sigma_3(S_4) + A_4\sigma_4(S_5) + A_5\sigma_5(S_6),$ $N_3 = B_0 + A_1\sigma_1(S_3) + A_2\sigma_2(S_4) + A_3\sigma_3(S_5) + A_4\sigma_4(S_6);$ $N_4 = B_0 + A_1\sigma_1(S_4) + A_2\sigma_2(S_5) + A_3\sigma_3(S_6);$ $N_5 = B_0 + A_1\sigma_1(S_5) + A_2\sigma_2(S_6);$ $N_6 = B_0 + A_1\sigma_1(S_6). \quad (2)$ where the $\sigma_i$ are the blur operators with different size (typically the $\sigma_1$ can be considered as an identity operator). The individual $S_i$ contributions can be solved 'from bottom to top'. Equations (2) account for six layers of a sample, however people having skill in the art would understand that this example relationship (or similar relationships) may be applied to other numbers of sample layers. Thus, the computing devices 208 are able to use the equations (2) to determine approximated solutions for each layer of a sample.

Once the contributions of each layer of the sample are determined in this way, the computing devices 208 may use the contributions to linearly combine two or more of the plurality of instances of image data to form reconstructed instances of data, where each reconstructed instance of datareflects the composition/structures within an individual layer of the sample. The computing devices 208 may then generate a reconstruction of a particular layer of the sample based on the reconstructed instances of data. In some embodiments, the computing devices 208 are further configured to construct a 3D reconstruction of the sample using one or more such layer reconstructions. As discussed above, because the individual reconstructions are based only on the data expected to have been resultant from emissions from structures within the corresponding layer of the sample, 3D reconstructions generated based on systems and methods of the present disclosure have a greatly reduced and/or eliminated amount of depth blur that is caused by the electron interaction depth of the imaging beam being greater than slice thicknesses. In some embodiments, the computing device(s) 208 may be further configured to only use a portion of the instances of data and/or generated layer reconstructions to construct the 3D reconstruction of the sample. For example, the computing devices 208 may determine layer reconstructions for all instances of data, and then only calculate a 3D reconstruction based on a subset of layer the reconstructions (i.e., layer reconstructions for layers below the $n^{th}$ and/or layer reconstructions not including the lowest n layers, etc.). In another example, the computing devices 208 may determine layer reconstructions for only instances of data that correspond to layers below a predetermined layer, and then generated the 3D reconstruction based on these reconstructions. Alternatively or in addition to this example, the computing devices 208 may determine layer reconstructions for only instances of data that correspond to layers above a predetermined layer, and then generated the 3D reconstruction based on these reconstructions. In this way, since reconstructions of layers at the top and/or bottom of the sample are based on fewer instances of data (and thus more unreliable), the computing devices 208 may only use a subset of more reliable reconstructions (i.e., subsets not including the topmost and/or bottommost nth layers) when creating the 3D reconstructions.

In some embodiments, the computing device(s) 208 may select the simulated model from a plurality of simulated models. For example, the computing device(s) 208 may have access to a plurality of simulated models that individually identify yield values and/or graphical relationships for slice and view imaging with particular sample characteristics (e.g., component materials, densities, sample types, stain characteristics, geometry, protocol for generating the sample, etc.) and/or a charged particle beam having particular beam characteristics (e.g., beam type, beam voltage, landing energy, beam energy, spot size, dwell time, etc.). For example, the computing devices may have access to a first simulated model that identifies a first set of yield values that each correspond to the portion of emissions that are expected to have been generated by material at a corresponding depth from the surface of the sample when the surface of the sample is irradiated by a charged particle beam having a first set of beam characteristics, and a second simulated model that identifies a second set of yield values that each correspond to the portion of emissions that are expected to have been generated by material at a corresponding depth from the surface of the sample when the surface of the sample is irradiated by a charged particle beam having a second set of beam characteristics. In such an example, the computing device(s) 208 may select the simulated model based on sample characteristics, a slice thickness of the individual layers, and/or beam characteristics.

Alternatively or in addition, the computing device(s) 208 may be configured to adjust the yield values of a simulated model based on sample characteristics, a slice thickness of the individual layers, and/or beam characteristics. In some embodiments, based on a user input specifying one or more of the sample characteristics and/or beam characteristics, the computing devices 208 may apply a weight to the yield values that compensates for the specified sample characteristics and/or beam characteristics. For example, based on a user input of the protocol for preparing the sample the computing devices 208 may select a simulated model that corresponds to sample characteristics and/or beam characteristics that match the protocol, and then based on a user input of slice thickness of the layers the computing devices 208 may determine yield values for depths corresponding to layer depths. Determining yield values for depths corresponding to layer depths may correspond to determining the yield values indicated by a curve/graphical representation for depths that individual layers will correspond to based on the slice thickness. Alternatively, determining yield values for depths corresponding to layer depths may correspond to interpolating between two yield values indicated by the simulated model to achieve an estimated yield value for a depth/depth region between the depths for the two yield values.

Figure 3:
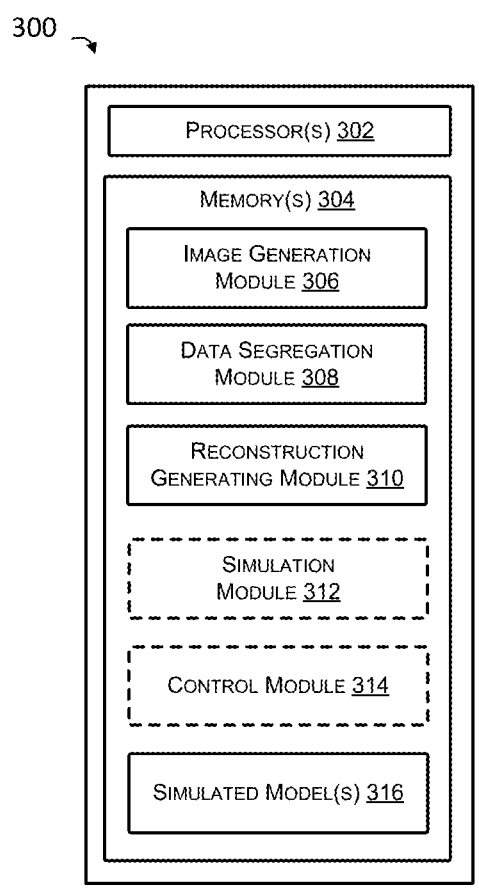
FIG. 3 shows a schematic diagram illustrating an example computing architecture 300 for using one or more simulated models to generate high-resolution reconstructions of samples imaged using slice and view processes where the electron interaction depth of the imaging beam is greater than slice thicknesses.

FIG. 3 shows a schematic diagram illustrating an example computing architecture 300 for using one or more simulated models to generate high-resolution reconstructions of samples imaged using slice and view processes where the electron interaction depth of the imaging beam is greater than slice thicknesses. For instance, FIG. 3 illustrates details of hardware and software components that can be used to implement the techniques described in the present disclosure. In various embodiments, the example computing architecture may correspond to the computing device(s) 208 illustrated in environment 200, and/or may be executable to execute the methods 400 described in FIG. 4.

Persons having skill in the art would understand that the computing architecture 300 may be implemented in a single computing device or may be implemented across multiple computing devices. For example, individual modules and/or data constructs depicted in computing architecture 300 may be executed by and/or stored on different computing devices. In this way, different process steps of the inventive methods disclosed herein may be executed and/or performed by separate computing devices and in various orders within the scope of the present disclosure. In other words, the functionality provided by the illustrated components may in some implementations be combined in fewer components or distributed in additional components. Similarly, in some implementations, the functionality of some of the illustrated components may not be provided and/or other additional functionality may be available.

In the example computing architecture 300, the computing device includes one or more processors 302 and memory 304 communicatively coupled to the one or more processors 302. The example computing architecture 300 can include an image generation module 306, a data segregation module 308, a reconstruction generating module 310, an optional simulation module 312, and an optional control module 314 stored in the memory 304.

The example computing architecture 300 is further illustrated as including one or more simulated model(s) 316 stored on memory 304. The one or more simulated model(s) 316 each identify a plurality of yield values, where individual yield values identify a sensitivity of the detected emissions resultant from irradiation of a sample to variations in material composition within corresponding layers/depths/depth ranges of the sample. For example, a simulated model 316 may identify a first yield value that corresponds to the sensitivity of detected emissions to variations in material composition in the surface layer of the sample (i.e., a topmost layer of the sample having a certain depth), and a second yield value that corresponds to the sensitivity of detected emissions to variations in material composition within a certain layer/depth/depth range of the sample below the surface layer. Individual simulated models may identify a number of discrete yield values and their corresponding layers/depth/depth (e.g., in a table), or may identify a curve and/or other graphical relationship between depth in the sample and corresponding yield value.

Individual simulated models of the one or more simulated model(s) 316 may identify yield values and/or graphical relationships for slice and view imaging with particular sample characteristics (e.g., component materials, densities, sample types, stain characteristics, geometry, protocol for generating the sample, etc.) and/or a charged particle beam having particular beam characteristics (e.g., beam type, beam voltage, landing energy, beam energy, spot size, dwell time, etc.). For example, the one or more simulated model(s) 316 may include a first simulated model that identifies a first set of yield values that each correspond to the expected sensitivities of emissions to variations in material composition at corresponding depths from the surface of the sample when the sample has a first set of sample characteristics, and a second simulated model that identifies a second set of yield values that each correspond to the expected sensitivities of emissions to variations in material composition in the surface of the sample when the sample has a second set of sample characteristics.

As used herein, the term "module" is intended to represent example divisions of executable instructions for purposes of discussion, and is not intended to represent any type of requirement or required method, manner, or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. As discussed above in various implementations, the modules described herein in association with the example computing architecture 300 can be executed across multiple computing devices.

The image generation module 306 can be executable by the processors 302 to generate images of individual layers of the sample based on instances of data generated during slice and view electron microscope imaging of a sample with an imaging beam that has an electron interaction depth that is greater than the slice thickness. Because the instances of data are based on the emissions emitted from the sample during irradiation of the surface of the sample, and because the electron interaction depth that is greater than the slice thickness, each of the instances of data includes portions of data that were emitted by structures located in one or more layer below the surface layer of the sample. This means that the images generated by the image generation module 306 depict and/or have information resultant from structures in one or more layers below the surface layer of the sample. As discussed above, the presence of structures/information from structures in layers below the surface layer cause depth blurring when the images generated by the image generation module 306 are used to generate 3D reconstructions of the sample. In some embodiments, the images are grayscale images that show contrasts indicative of the shape and/or the materials of the sample.

The data segregation module 308 can be executable by the processors 302 to segregate each of images generated by the image generation module 306 and/or the instances of data into component portions, where individual segregated portions individual images/instances of data are a portion of the individual images/instances of data that are determined by the data segregation module 308 to be resultant from emissions from structures within a particular layer of the sample. For example, if the slice and view imaging of the sample comprised imaging three layers of the sample (i.e., a first surface layer, a second layer below the first layer, and a third layer below the second layer), the data segregation module 308 may generate at least three component portions of the image/instance of data for the first surface layer. These at least three component portions would include a first portion determined to have been resultant from emissions by structures within the first surface layer of the sample, a second portion determined to have been resultant from emissions by structures within the second layer of the sample, and a third portion determined to have been resultant from emissions by structures within the third layer of the sample.

The data segregation module 308 is configured to use the one or more simulated models 316 to determine the estimated contributions of different layers of the sample to the images/instances of data captured during slice and view imaging of a sample. More specifically, the data segregation module 308 is configured to use the yield values specified by a simulated model 316 to linearly combine two or more of the images/instances of data to form instances of reconstructed image data that each reflect the composition/structures within an individual layer of the sample (i.e., where data/emission resultant from layers other than the corresponding individual layer have been removed).

The data segregation module 308 may first select a simulated model 316 from a plurality of simulated models 316 based on one or more sample characteristics and/or beam characteristics. For example, based on receiving input (e.g., a user input, a sensor input, an API input, etc.) specifying one or more characteristics sample and/or imaging beam, the data segregation module 308 may then select a particular simulated model 316 that best matches the input characteristics. Alternatively or in addition, the data segregation module 308 may be executable to adjust the yield values of a simulated model based on sample characteristics, a slice thickness of the individual layers, and/or beam characteristics. For example, based on a user input of the protocol for preparing the sample, the data segregation module 308 may apply a weight to a yield value specified by the simulated model 316 to compensate for a material composition of the sample and/or a protocol used to create the sample. In this way, in such embodiments the data segregation module 308 can ensure it uses a simulated model 316 that identifies yield values which are most relevant to the current slice and view images/instances of image data.

The data segregation module 308 are further executable to cause the processors 302 to use the yield values and/or graphical relationships to generate reconstructions of individual layers of the sample. Specifically, the data segregation module 308 is configured to use the yield values specified by the simulated model to determine reconstructed image data that each reflect the composition/structures within an individual layer of the sample. Because it is known how much of the sample was removed between irradiations of the sample, the data segregation module 308 is able to determine the depth/depth range of each layer of the sample when the irradiation corresponding to each image/instance of data occurred. Then, because the data segregation module 308 knows the depth/depth range of an individual layer during each irradiation, the data segregation module 308 may use the yield values specified by the simulated model to determine an instance of reconstructed data that is expected to have been generated by structures within the individual layer. Additionally, in some embodiments the segregation module 308 is further executable to account for blurring of information from individual layers.

In an example embodiment, the data segregation module 308 may determine the portion/ratio of each image/instance of image data that is expected to have been generated by structures within the individual layers of the sample at least partially by applying one or more algorithms that use the relationship:

$$N_i = B_0 + \begin{bmatrix} A_1 & A_2 & A_3 & \ldots & A_n \\ 0 & A_1 & A_2 & \ldots & A_{n-1} \\ 0 & 0 & A_1 & \ldots & A_{n-2} \\ \vdots & \vdots & \vdots & \ddots & \vdots \\ 0 & 0 & 0 & \ldots & A_1 \end{bmatrix} \cdot \begin{bmatrix} S_1 \\ S_2 \\ S_3 \\ S_4 \\ \vdots \\ S_n \end{bmatrix}. \quad (1)$$

to identify the contributions of structures within each layer to each image/instance of image data. As discussed above, $N_i$ corresponds to the set of i instances of data generated during slice and view imaging of the sample, $A_n$ corresponds to the $n^{th}$ yield value of the simulated model, $S_n$ corresponds to the $n^{th}$ layer of the sample, and $B_0$ corresponds to the expected background noise generated by a charged particle system during irradiation of a sample.

The reconstruction generating module 310 can be executable by the processors 302 to generate reconstructions of individual layers of the sample based on the segregated portions of images/instances of reconstructed data determined by the data segregation module 308. For example, the reconstruction generating module 310 may combine two or more of the segregated portions of images/instances of reconstructed data that correspond to a particular layer of the sample to generate a reconstruction of the particular sample. In this way, each of the reconstructions are entirely based on portions of images/data that are determined to have been resultant from emissions from within the layer of the sample that the reconstruction depicts. These reconstructions may correspond to reconstructed images of individual layers of the sample.

Additionally, in some embodiments the reconstruction generating module 310 can be further executable by the processors 302 to generate a 3D reconstruction of the sample based on the reconstructions of individual layers. Because the individual reconstructions are based only on the data expected to have been resultant from emissions from structures within the corresponding layer of the sample, the 3D reconstructions generated based on systems and methods of the present disclosure have a greatly reduced and/or eliminated amount of depth blur that is caused by the electron interaction depth of the imaging beam being greater than slice thicknesses.

The simulation module 312 can be executable to generate the one or more simulated model(s) 316. The simulation module 312 is executed to generate the simulated model(s) 316 at least in part by a computationally simulated irradiation of a modeled sample that simulated the detection of emissions that were generated by structures at different depths of the sample. In some embodiments, the computationally simulated irradiation may be performed via a Monte Carlo simulation. For example, the computationally simulated irradiation may correspond to the simulation of an irradiation of the modeled sample, a simulation of emissions from structures at different depths of the sample resultant from the simulated irradiation, and the simulated detection of the simulated emissions. Alternatively, the computationally simulated irradiation of the modeled sample may simulate the amount of emissions detected by a detector system that were generated by structures at a particular depth/depth range of the modeled sample. Such a simulation can then be repeated for different depths/depth ranges within the sample. Based on the computationally simulated irradiation, a plurality of yield values and/or a graphical relationship that correspond to the sensitivity of the detected emissions resultant from irradiation of a sample to variations in material composition at a corresponding depth/depth range of the sample.

In some embodiments, the computationally simulated irradiation of the model is conducted with a modeled sample having particular sample characteristics (e.g., component materials, densities, sample types, stain characteristics, geometry, protocol for generating the sample, etc.) and/or a charged particle beam having particular beam characteristics (e.g., beam type, beam voltage, landing energy, beam energy, spot size, dwell time, etc.). In this way, the yield values and/or graphical relationships determined from such a computationally simulated irradiation may be specifically tuned to images/instances of data obtained using slice and view imaging with similar sample and/or charged particle beam characteristics.

The control module 314 can be executable by the processors 302 to cause a computing device and/or microscope system (e.g., example microscope system(s) 204) to take one or more actions. For example, the control module 314 may cause a microscope system to perform a slice and view processing of a sample where the electron interaction depth of the imaging beam is greater than the thickness of the layers removed by the delayering component (e.g., the FIB column 212).

As discussed above, the computing architecture 300 include one or more processors 302 configured to execute instructions, applications, or programs stored in a memory(s) 304 accessible to the one or more processors. In some examples, the one or more processors 302 may include hardware processors that include, without limitation, a hardware central processing unit (CPU), a graphics processing unit (GPU), and so on. While in many instances the techniques are described herein as being performed by the one or more processors 302, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 304 accessible to the one or more processors 302 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory 304 and other storage devices for purposes of memory management and data integrity. Alternatively, in other implementations, some or all the software components may execute in memory on another device and communicate with the computing devices. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing devices may be transmitted to the computing devices via transmission media or signals such as electrical, electromagnetic, or digital signals, conveyed via a communication medium such as a wireless link. Various implementations may further include receiving, sending, or storing instructions and/or data implemented in accordance with the foregoing description upon a computer-accessible medium.

Figure 4:
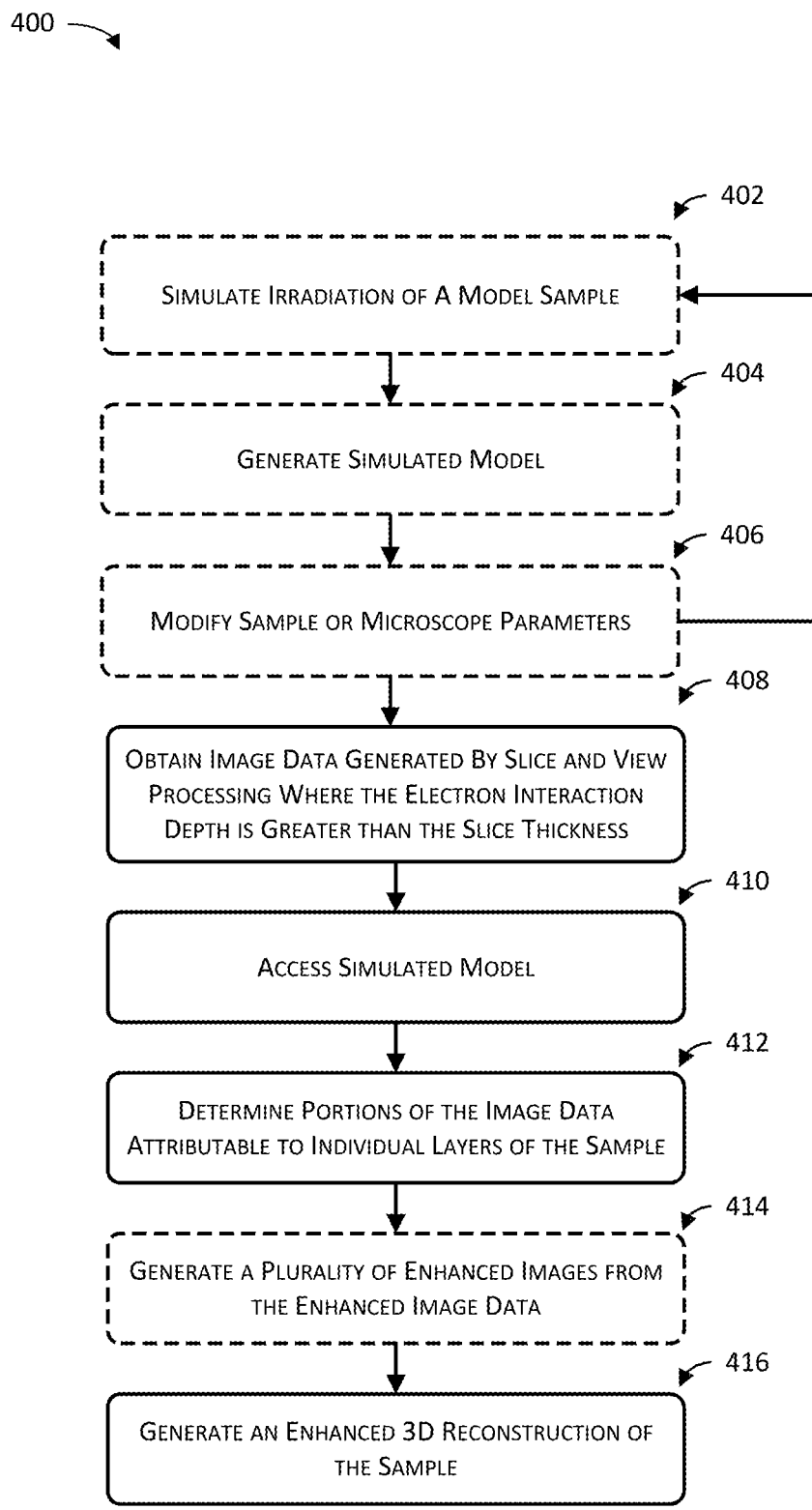
FIG. 4 illustrates a sample process for using, training, optimizing, and/or retraining depth blur reducing algorithms for generating high-resolution reconstructions of 3D samples imaged using slice and view processes where the electron interaction depth of the imaging beam is greater than slice thicknesses.

FIG. 4 is a flow diagram of illustrative processes depicted as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

Specifically, FIG. 4 is a flow diagram of an illustrative process 400 for using a simulated model to generate high-resolution reconstructions of samples imaged using slice and view processes where the electron interaction depth of the imaging beam is greater than slice thicknesses. The process 400 may be implemented in environment 300 and/or by one or more computing device(s) 208, and/or by the computing architecture 300, and/or in other environments and computing devices.

At 402, a simulation of an irradiation of a model sample with an imaging beam is optionally performed. For example, the simulation may be a computationally simulated irradiation of a modeled sample that simulated the detection of emissions that were generated by structures at one or more depths/depth ranges of the sample. In some embodiments, the computationally simulated irradiation may be performed via a Monte Carlo simulation.

At 404, a simulated model is optionally generated based on the simulated irradiation of the model sample. Specifically, based on the computationally simulated irradiation, a plurality of yield values and/or a graphical relationship that correspond to the portion/ratio of the detected emissions resultant from irradiation of a sample that is expected to be generated by structures at a corresponding depth/depth range of the sample.

At 406, one or more sample or microscope parameters in the computational simulation are optionally modified. For example, one or more modifications to particular sample characteristics (such as component materials, densities, sample types, stain characteristics, geometry, protocol for generating the sample, etc.) and/or imaging beam characteristics (such as beam type, beam voltage, landing energy, beam energy, spot size, dwell time, etc.). In such embodiments, the process returns to step 402, where an additional simulation of an irradiation of a model sample with an imaging beam is performed with the modified parameters. A new simulated model may then be generated at step 404 based on the additional simulation. In this way, process 400 may optionally include the generation of multiple simulated models, where individual simulated models identify yield values that are configured for specific sample and/or imaging beam conditions.

At 408, image data of a sample is obtained, where the image data was generated using a slice and view process where the electron depth of the imaging beam is greater than the slice thickness. In some embodiments, the image data of the sample is obtained via processing of the sample by a microscope system, such as the dual-beam microscope system described in environment 200. However, in other embodiments, obtaining the data may comprise obtaining the image data via a wired or wireless connection (e.g., a WAN, a LAN, a cable hookup, etc.), or from another memory device storing the training data (e.g., another computer memory, a hard drive, a CD-ROM, a portable memory device, etc.).

At 410, a simulated model is accessed. The simulated model may be obtained by a computing device by a wired or wireless connection (e.g., a WAN, a LAN, a cable hookup, etc.), or from another memory device storing the training data (e.g., another computer memory, a local memory, a hard drive, a CD-ROM, a portable memory device, etc.). In some embodiments, the simulated model may be selected from a plurality of simulated models based on one or more sample characteristics and/or beam characteristics.

At 412, the portions of the image data attributable to individual layers of the sample are determined. That is, each instance of image data and/or each image generated from such an instance is segregated into component portions, where individual component portions correspond to portions of the individual images/instances of data that are expected to have been resultant from emissions from structures within a particular layer of the sample. More specifically, two or more yield values from the simulated model are used to determine the estimated contributions of different layers of the sample to the images/instances of image data.

These estimated contributions are then used to identify portions of the images/instances of image data that are present across the images/instances of image data in the corresponding estimated contributions. That is, since the structures within a particular layer of the sample remain constant through slice and view imaging, these structures should contribute similar information to each image/instance of image data. Because of this, once the sensitivities of the emissions to structures from each layer of the sample are determined, information present in each of the images may be segregated and/or linearly combined to generate instances of simulated data that are each expected to have been generated by structures within a single layer of the sample.

At 414, a plurality of reconstructions of individual layers of the sample is optionally generated based on the determined portions of the image data attributable to individual layers of the sample. Because each of the individual determined portions/instances of simulated data comprises image information/data that was determined to have been resultant from structures within a particular layer of the sample, multiple such determined portions corresponding to a particular layer of the sample may be used to generate a reconstruction of the corresponding particular layer of the sample. Accordingly, each of these reconstructions is entirely based on portions of images/data that have been determined to have been resultant from emissions from within the particular layer of the sample that the reconstruction depicts.

At 416, an enhanced 3D reconstruction of the sample is generated based on the determined portions of the image data attributable to individual layers of the sample and/or the reconstructions of the sample. Because the individual reconstructions are based only on the data expected to have been resultant from emissions from structures within the corresponding layer of the sample, the 3D reconstructions generated based on systems and methods of the present disclosure have a greatly reduced and/or eliminated amount of depth blur that is caused by the electron interaction depth of the imaging beam being greater than slice thicknesses.

Figure 5:
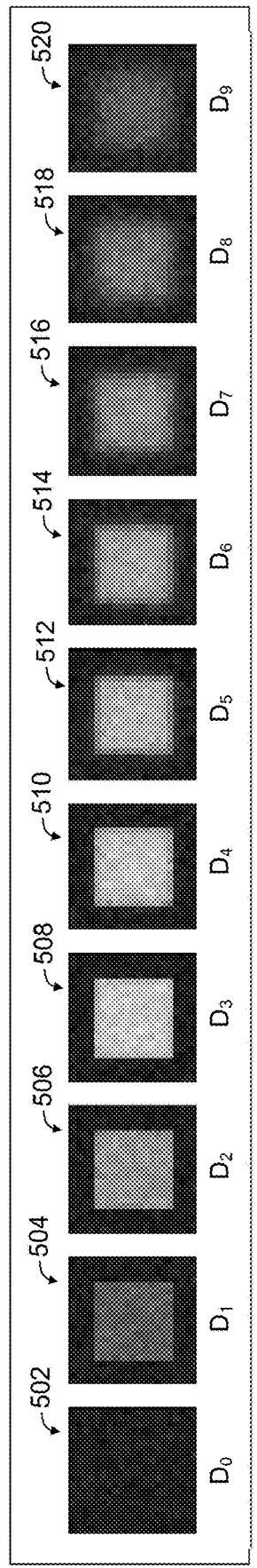
FIG. 5 shows a plurality of images depicting simulated emissions from a computational simulation of irradiation of a model sample at different depths/depth ranges.

FIG. 5 shows a plurality of simulated images 500 depicting simulated emissions from a computational simulation of irradiation of a model sample at different depths/depth ranges. Specifically, FIG. 5 shows images 502-520 that each depict the emissions that were simulated to have been emitted from structures within a corresponding depth/depth range $D_0$-$D_9$ of a model sample during a computational simulation of irradiation of the model sample. In FIG. 5, $D_0$ is a depth above the sample, and thus the emissions depicted in image 502 correspond to simulated noise generated by a simulated environment of the model sample. Additionally, images depict how both the quantity of detection events/information within the images decrease as the distance between the corresponding depth/depth range and the surface increases.

FIG. 6 shows an example of a simulated model 600 that identifies a plurality of yield values for different depths/depth ranges. Specifically, FIG. 6 shows a graphical relationship that corresponds to the sensitivities of the detected emissions resultant from irradiation of a sample to variations in material composition/structures at a corresponding depth/depth range of the sample. Simulated model 600 includes a first curve 602 that shows a relationship between simulated backscatter electron yields (i.e., a yield value) $A_1$-$A_7$ determined at least in part by a computational simulation of an irradiation of a model sample, and a corresponding depth/depth range D1-D7. Alternatively or in addition, curve 602 may show the sensitivities of total emissions (i.e., a yield value) $A_1$-$A_7$ to variations in material composition in particular depths/depth ranges of the sample D1-D7. For example, the curve may identify a sensitivity (e.g., a fraction, a percentage, a weight between 0-1, etc.) for specific depths/depth ranges. Additionally, simulated model 600 is shown as including a second curve 604 that identifies an expected level of noise $B_0$ expected to be generated by the environment of the sample at different depths/depth ranges.

Figure 7:
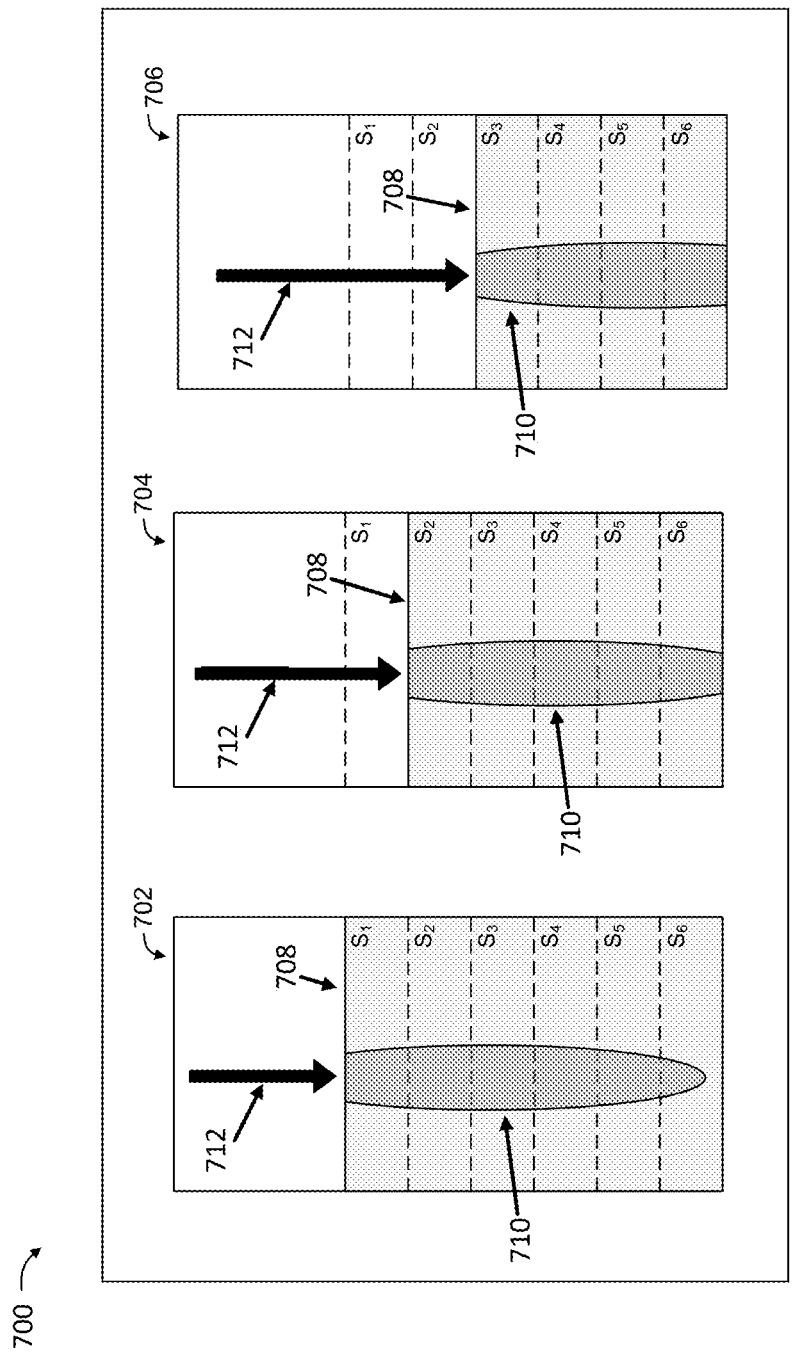
FIG. 7 shows a visual depiction of the relative positions of layers of a sample at different imaging instances during slice and view imaging of the sample.

FIG. 7 is a visual depiction 700 of the relative positions of layers of a sample at different imaging instances during slice and view imaging of the sample. For example, in image 702 a primary layer $S_1$ is depicted as being a surface layer of sample 708. Image 702 further shows a secondary layer $S_2$, a tertiary layer $S_3$, a quaternary layer $S_4$, etc. below the primary layer $S_1$ of the sample. Image 702 depicts an electron interaction region 710 of an imaging beam 712. The ratio/amount of emissions that are expected to be detected from structures within each layer may be estimated using a simulated model and based on the depth/depth range of the corresponding layer.

Similarly, image 704 shows sample 708 after the primary layer $S_1$ has been removed. Accordingly, the ratio/amount of emissions that are expected to be detected from structures within the secondary layer $S_2$ is now expected to correspond to the yield value for a surface layer of sample 708, and the ratio/amount of emissions that are expected to be detected from structures within the tertiary layer $S_3$ is expected to correspond to the yield value for the layer immediately below the surface layer. Moreover, as the primary layer $S_1$ has been removed, its contribution to a corresponding image/instance of image data is expected to be 0.

Image 706 shows sample 708 after the secondary layer $S_2$ has been removed. Accordingly, the ratio/amount of emissions that are expected to be detected from structures within the tertiary layer $S_3$ is now expected to correspond to the yield value for a surface layer of sample 708, and the ratio/amount of emissions that are expected to be detected from structures within the quaternary layer $S_4$ is expected to correspond to the yield value for the layer immediately below the surface layer. Moreover, as the primary layer $S_1$ and secondary layer $S_5$ have been removed, their contribution to a corresponding image/instance of image data is expected to be 0.

Figure 8:
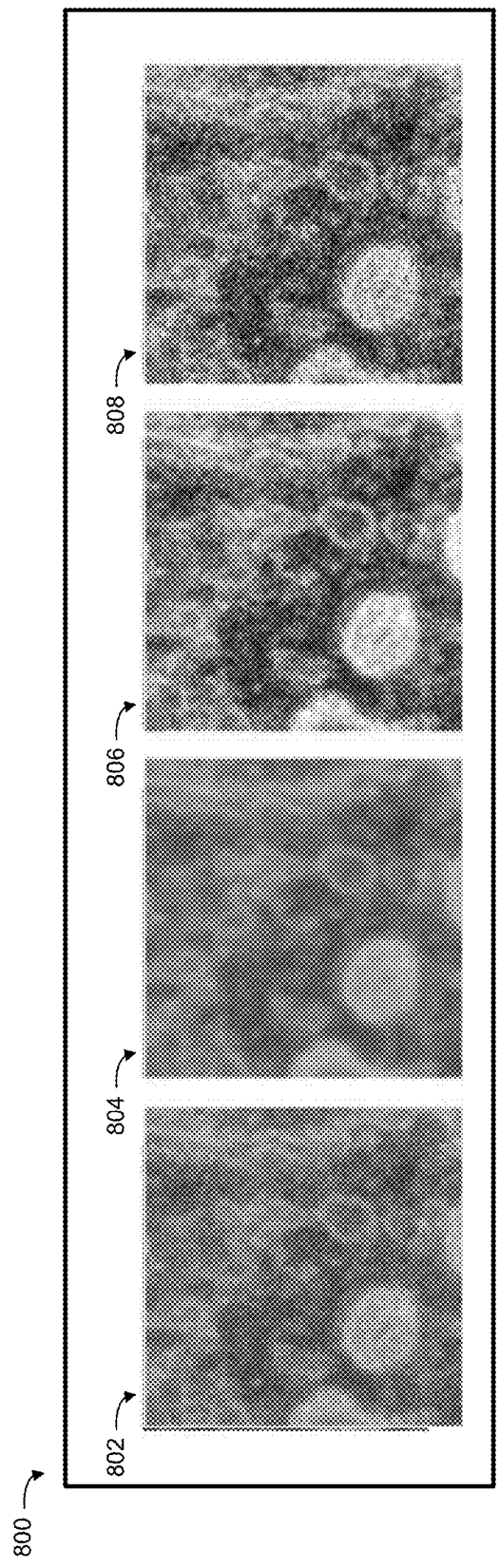
FIGS. 8-10 are experimental results that show slice and view images processed with the inventive process compared to slice and view images by prior art systems.
Figure 9:
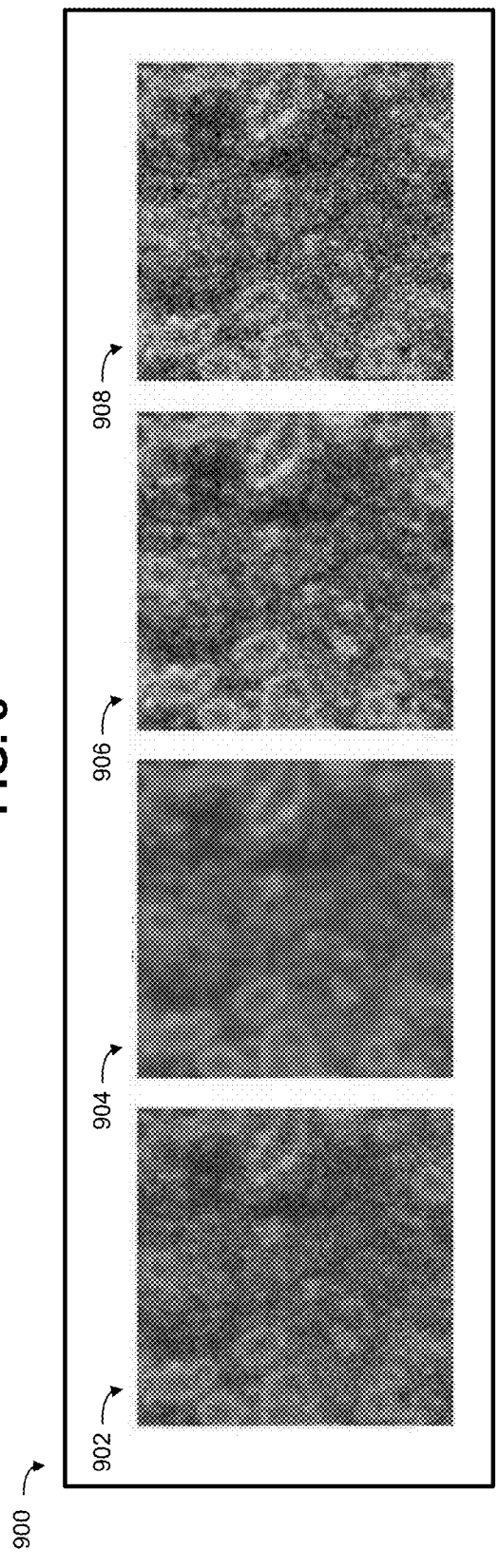
Figure 10:
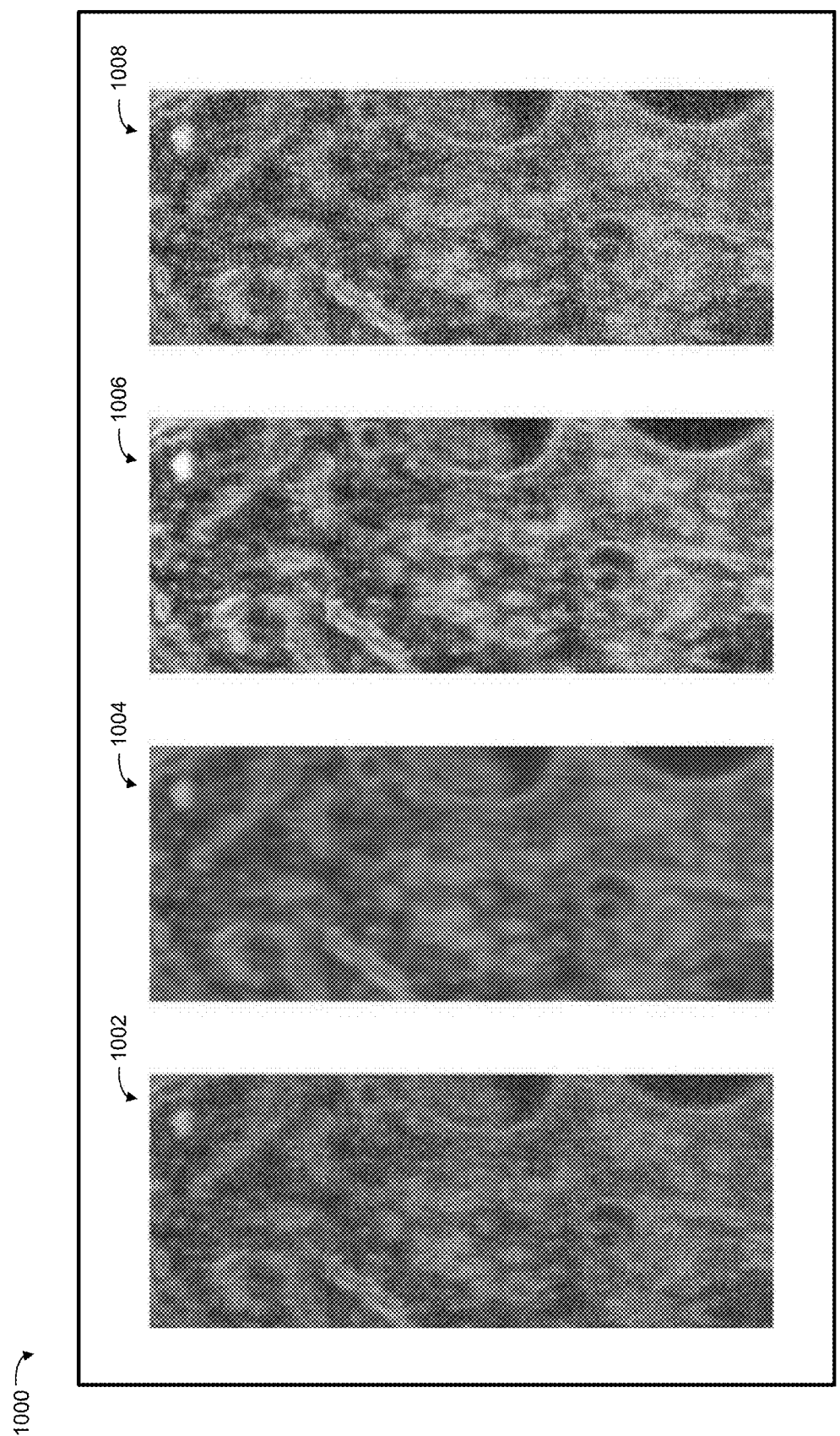

FIGS. 8-10 show slice and view images processed with the inventive process compared to slice and view images by prior art systems. For example, images 802, 902, and 1002 show an image of a layer of a sample obtained via slice and view processing where the electron penetration depth of the imaging beam is greater than the slice thickness. Images 804, 904, and 1004 show the results of applying image enhancement filters to the original data of images 802, 902, and 1002, respectively. Images 806, 906, and 1006 show the results of processing the original data of images 802, 902, and 1002, respectively, using a simulated model according to the present disclosure. Images 808, 908, and 1008 are the results of applying a deconvolution algorithm to post-process the original data of images 802, 902, and 1002, respectively. As can be seen, the methods and systems of the present disclosure cause an improvement in the resolution of the sample compared to the prior art systems while also increasing the signal to noise ratio of the images.

Examples of inventive subject matter according to the present disclosure are described in the following enumerated paragraphs.

A1. A method for simulation based reconstructions of slice and view charged particle images to remove depth blur, the method comprising: acquiring first data relating to a first layer of a sample, the first data having been acquired by a first irradiation of the first layer of the sample with a charged particle beam; acquiring second data relating to a second layer of the sample, the second data having been acquired by a second irradiation of the second layer of the sample with the charged particle beam, wherein: the first layer of the sample is removed between the first irradiation and the second irradiation; and an electron interaction depth of the charged particle beam is larger than both the thickness of the first layer and the thickness of the second layer; accessing a simulated model that identifies a first yield value and a second yield value, wherein: the first yield value corresponds to both a first expected amount of the first data that is attributable to emission from the first layer of the sample, and a second expected amount of the second data that is attributable to emission from the second layer of the sample;

and the second yield value corresponds to a third expected amount of the first data that is attributable to emission from the second layer of the sample; and determining a first reconstruction of the first layer and a second reconstruction of the second layer based on the simulated model, the first data, and the second data.

A1.1. The method of paragraph A1, further comprising constructing a 3D reconstruction of the sample using the first reconstruction and the second reconstruction.

A1.2. The method of any of paragraphs A1-A1.1, wherein the first yield value corresponds to the portion of the detected emissions that is expected to have been generated by the surface layer of the sample.

A1.3. The method of any of paragraphs A1-A1.2, wherein each yield value identifies a portion of the detected emissions that is expected to be generated by structures at a corresponding depth of the sample.

A2. The method of any of paragraphs A1-A1.1, further including acquiring third data relating to a third layer of the sample, the third data having been acquired by a third irradiation of the third layer of the sample with the charged particle beam, wherein: the second layer of the sample is removed between the second irradiation and the third irradiation; and the electron interaction depth of the charged particle beam is larger than the thickness of the third layer.

A2.1 The method of paragraph A2, further comprising determining a third reconstruction of the third layer based on the simulated model, the first data, the second data, and the third data.

A2.1.1. The method of paragraph A2.1, wherein constructing the 3D reconstruction of the sample also uses the third reconstruction.

A2.2. The method of any of paragraphs A2-A.2.1, wherein the first yield value further corresponds to a fourth expected amount of the first data that is attributable to emission from the third layer of the sample.

A2.3. The method of any of paragraphs A2-A.2.2, wherein the second yield value further corresponds to a fifth expected amount of the second data that is attributable to emission from the third layer of the sample A2.4. The method of any of paragraphs A2-A.2.3, wherein the simulated model further identifies a third yield value that corresponds to a sixth expected amount of the third data that is attributable to the third layer of the sample.

A3. The method of any of paragraphs A1-A2.4, further including acquiring a plurality of instances of additional data where each instances relates to a different layer of the sample, and each of the instances of additional data having been acquired by a irradiation of its corresponding layer of the sample with the charged particle beam, wherein: a layer of the sample is removed between successive irradiations by the charged particle beam; and the electron interaction depth of the charged particle beam is larger than the thickness of the individual layers removed.

A3.1. The method of paragraph A3, further comprising determining reconstructions of a plurality of layers based on the simulated model, the first data, the second data, the third data, and the plurality of instances of additional data.

A3.2. The method of any of paragraphs A3-A.2.1, wherein the simulated model further identifies a plurality of additional yield values, where each individual yield value of the plurality of additional yield values corresponds to an expected amount of the first data that is attributable to emission from a corresponding layer of the plurality of layers.

A4. The method of any of paragraphs A1-A3.2, wherein the simulated model comprises a plurality of yield values, individual yield values identifying a portion of emissions that are expected to have been generated by material at a corresponding depth from the surface of the sample when the surface of the sample is irradiated.

A4.1. The method of paragraph A4, wherein the model identifies a corresponding depth from the surface of the sample for each of a plurality of yield values.

A4.2. The method of paragraph A4, wherein the simulated model comprises a curve of expected yield values at corresponding depths from the surface.

A4.3. The method of any of paragraphs A4-A4.2, wherein the model comprises at least: a first set of yield values that each identify the portion of emissions that are expected to have been generated by material at a corresponding depth from the surface of the sample when the surface of the sample is irradiated by a charged particle beam having a first set of beam characteristics; and a second set of yield values that each identify the portion of emissions that are expected to have been generated by material at a corresponding depth from the surface of the sample when the surface of the sample is irradiated by a charged particle beam having a second set of beam characteristics.

A4.3.1. The method of paragraph A4.3, wherein the beam characteristics correspond to one or more of, beam type, beam voltage, landing energy, beam energy, spot size, and dwell time.

A4.4. The method of any of paragraphs A4-A4.3, wherein the model comprises at least: a first set of yield values that each identify the portion of emissions that are expected to have been generated by material at a corresponding depth from the surface of a sample having a first set of material characteristics; and a second set of yield values that each identify the portion of emissions that are expected to have been generated by material at a corresponding depth from the surface of a sample having a second set of material characteristics.

A4.4.1. The method of paragraph A4.4, wherein the sample characteristics correspond to one or more of, component materials, densities, sample types, stain characteristics, geometry, and protocol for generating the sample.

A5. The method of any of paragraphs A1-A4.4.1, wherein the simulated model is generated at least in part by a computationally simulated irradiation of a modeled sample.

A5.1. The method of paragraph A5, wherein the computationally simulated irradiation is performed via a Monte Carlo simulation.

A5.2. The method of any of paragraphs A5-A5.1, wherein the computationally simulated irradiation of the modeled sample simulates amounts of emissions detected by a detector system that were generated by structures at different depths of the sample.

A5.3. The method of any of paragraphs A5-A5.2, wherein the computationally simulated irradiation of the modeled sample simulates the amount of emissions detected by a detector system that were generated by structures at a particular depth of the modeled sample.

A5.4. The method of any of paragraphs A5-A5.3, wherein the simulated model is generated at least in part by a computationally simulated irradiation of a modeled sample having particular sample characteristics with a charged particle beam having beam characteristics.

A5.4.1. The method of paragraph A5.4, wherein a plurality of simulated models are generated via computationally simulated irradiation, wherein each of the simulated models are generated using corresponding sets of sample characteristics and/or beam characteristics.

A6. The method of any of paragraphs A1-A5.4.1, wherein determining the first reconstruction of the first layer corresponds to: using the first yield value to identify a first amount of the second data that was generated based on emissions from structures within the second layer; using the second yield value to identify a second amount of the first data that was generated based on emissions from structures within the second layer.

A6.0.1. The method of paragraph A6, wherein determining the first reconstruction of the first layer further includes subtracting a fraction of the second data from the first data to generate the first reconstruction of the first layer, where the fraction is derived from the first and second yield values.

A6.1. The method of paragraph A6, further comprising selecting a simulated model from the plurality of simulated models based on sample characteristics, a slice thickness of the individual layers, and/or beam characteristics.

A6.2. The method of any of paragraphs A6-A6.1, further comprising adjusting the yield values of the simulated model based on sample characteristics, a slice thickness of the individual layers, and/or beam characteristics.

A6.2.1. The method of paragraph A6.2, wherein adjusting the yield values corresponds to applying a weight that compensates the corresponding expected amounts to accommodate the sample characteristics, a slice thickness of the individual layers, and/or beam characteristics.

A6.3. The method of any of paragraphs A6-A6.1, further comprising determining the yield values of the simulated model based on sample characteristics, a slice thickness of the individual layers, and/or beam characteristics.

A6.3.1. The method of paragraph A6.3, wherein determining the yield values comprises selecting a yield curve based on sample characteristics, and/or beam characteristics.

A6.3.1.1. The method of paragraph A6.3.1, wherein determining the yield values comprises selecting one or more values on the selected yield curve based on the slice thickness of the individual layers.

A7. The method of any of paragraphs A1-A6, wherein determining the first reconstruction of the first layer and the second reconstruction of the second layer corresponds to solving the relationship:

$$N_i = B_0 + \begin{bmatrix} A_1 & A_2 & A_3 & \ldots & A_n \\ 0 & A_1 & A_2 & \ldots & A_{n-1} \\ 0 & 0 & A_1 & \ldots & A_{n-2} \\ \vdots & \vdots & \vdots & \ddots & \vdots \\ 0 & 0 & 0 & \ldots & A_1 \end{bmatrix} \cdot \begin{bmatrix} S_1 \\ S_2 \\ S_3 \\ S_4 \\ \vdots \\ S_n \end{bmatrix}.$$

A7.1. The method of paragraph A7, wherein $N_i$ corresponds to the set of i instances of data generated during slice and view imaging of the sample.

A7.2. The method of any of paragraphs A7-A7.1, wherein $A_n$ corresponds to the $n^{th}$ yield value of the simulated model.

A7.3. The method of any of paragraphs A7-A7.2, wherein $S_n$ corresponds to the $n^{th}$ layer of the sample.

A7.4. The method of any of paragraphs A7-A7.3, wherein $B_0$ corresponds to the expected background noise generated by a charged particle system that generated the first data and the second data.

A8. The method of any of paragraphs A1-A7.4, further comprising receiving an input of one or more of a geometry of the sample, a composition of the materials in the sample, a protocol for creating the sample, a slice thickness of layers in the sample, or a combination thereof.

A8.1. The method of paragraph A8, wherein the first yield value and the second yield value are determined based on the input.

A9. The method of any of paragraphs A1-A8.1, wherein the first layer of the sample is removed with one or more of: a focused ion beam; a laser; an electron beam; and a diamond blade.

A10. The method of any of paragraphs A1-A9, wherein the charged particle beam is an electron beam.

A10.1. The method of paragraph A10, wherein the electron beam is a single energy electron beam.

A11. The method of any of paragraphs A1-A10.1, further comprising the steps of: generating a first image of the first layer of the sample; and generating a second image of the second layer of the sample.

B1. A charged particle microscope system, the system comprising: a sample holder configured to hold a sample; an electron beam source configured to emit an electron beam toward the sample; an electron beam column configured to direct the electron beam onto the sample; a delayering component configured to remove a layer from the surface of the sample, the layer having a known thickness; one or more detectors configured to detect emissions resultant from the electron beam irradiating the sample; one or more processors; and a memory storing instructions that when executed on the one or more processors causes the charged particle microscope system to perform the method of any of paragraphs A1-A10.2.

C1. Use of the system of B1 to perform a method of any of paragraphs A1-A11.

E1. A non-transitory computer readable medium storing instructions that, when executed by a processor, cause a computing system to perform the method of any of paragraphs A1-A11.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "determine," "identify," "produce," and "provide" to describe the disclosed methods. These terms are high-level abstractions of the actual operations that are performed. The actual operations that correspond to these terms will vary depending on the particular implementation and are readily discernible by one of ordinary skill in the art.

What is claimed is:

1. A method for simulation-based reconstructions of slice and view charged particle images to remove depth blur, the method comprising:
    acquiring first data relating to a first layer of a sample, the first data having been acquired by a first irradiation of the first layer of the sample with a charged particle beam;
    acquiring second data relating to a second layer of the sample, the second data having been acquired by a second irradiation of the second layer of the sample with the charged particle beam, wherein:
        the first layer of the sample is removed between the first irradiation and the second irradiation; and
        an electron interaction depth of the charged particle beam is larger than both the thickness of the first layer and the thickness of the second layer;
    accessing a simulated model that identifies a first yield value and a second yield value, wherein:
        the first yield value corresponds to both a first expected amount of the first data that is attributable to emission from the first layer of the sample, and a second expected amount of the second data that is attributable to emission from the second layer of the sample; and
        the second yield value corresponds to a third expected amount of the first data that is attributable to emission from the second layer of the sample; and
    determining a first reconstruction of the first layer and a second reconstruction of the second layer based on the simulated model, the first data, and the second data.

2. The method of claim 1, wherein determining the first reconstruction of the first layer corresponds to:
    using the first yield value to identify a first portion of the second data that was generated based on emissions from structures within the second layer; and
    using the second yield value to identify a second portion of the first data that was generated based on emissions from structures within the second layer of the sample.

3. The method of claim 2, wherein determining the first reconstruction of the first layer further includes subtracting a fraction of the second data from the first data to generate the first reconstruction of the first layer, where the fraction is derived from the first and second yield values.

4. The method claim 1, further comprising determining a 3D reconstruction of the sample using the first reconstruction, the second reconstruction, and the relationship:

$$N_i = B_0 + \begin{bmatrix} A_1 & A_2 & A_3 & \dots & A_n \\ 0 & A_1 & A_2 & \dots & A_{n-1} \\ 0 & 0 & A_1 & \dots & A_{n-2} \\ \vdots & \vdots & \vdots & \ddots & \vdots \\ 0 & 0 & 0 & \dots & A_1 \end{bmatrix} \cdot \begin{bmatrix} S_1 \\ S_2 \\ S_3 \\ S_4 \\ \vdots \\ S_n \end{bmatrix}.$$

5. The method of claim 1, wherein the first yield value corresponds to the portion of the detected emissions that is expected to have been generated by the surface layer of the sample.

6. The method of claim 1, wherein each yield value identifies a portion of the detected emissions that is expected to be generated by structures at a corresponding depth of the sample.

7. The method of claim 1, further including acquiring third data relating to a third layer of the sample, the third data having been acquired by a third irradiation of the third layer of the sample with the charged particle beam, wherein:
    the second layer of the sample is removed between the second irradiation and the third irradiation; and
    the electron interaction depth of the charged particle beam is larger than the thickness of the third layer.

8. The method of claim 7, wherein the first yield value further corresponds to a fourth expected amount of the third data that is attributable to emission from the third layer of the sample.

9. The method of claim 8, further comprising determining a second reconstruction of the second layer by:
    using the first yield value to identify a first portion of the third data that was generated by structures within the third layer;
    using the second yield value to identify a second portion of the second data that was generated by structures within a third layer of the sample; and subtracting a fraction of the third data from the second data to generate the second reconstruction of the second layer, where the fraction is derived from the second and third yield values.

10. The method of claim 7, wherein the second yield value further corresponds to a fifth expected amount of the second data that is attributable to emission from the third layer of the sample.

11. The method of claim 1, further comprising:
    accessing a plurality of blurring coefficients that each identify an expected amount of blurring for emissions resultant from structures at a corresponding depth of the sample;
    determining an expected variation in blurring of contributions from different layers of the sample based on the plurality of blurring coefficients; and
    wherein determining the first reconstruction of the first layer and the second reconstruction of the second layer is further based on the expected variation in blurring of contributions from different layers of the sample.

12. The method of claim 1, wherein the simulated model comprises a plurality of yield values, individual yield values identifying a portion of emissions that are expected to have been generated by material at a corresponding depth from the surface of the sample when the surface of the sample is irradiated.

13. The method of claim 1, wherein the simulated model comprises at least:
    a first set of yield values that each identify the portion of emissions that are expected to be have been generated by material at a corresponding depth from the surface of the sample when the surface of the sample is irradiated by a charged particle beam having a first set of beam characteristics; and
    a second set of yield values that each identify the portion of emissions that are expected to be have been generated by material at a corresponding depth from the surface of the sample when the surface of the sample is irradiated by a charged particle beam having a second set of beam characteristics.

14. The method of claim 1, wherein the simulated model is generated at least in part by a computationally simulated irradiation of a modeled sample, where the computationally simulated irradiation of the modeled sample simulates amounts of emissions detected by a detector system that were generated by structures at different depths of the sample.

15. The method of claim 14, wherein the simulated model is generated at least in part by a computationally simulated irradiation of a modeled sample having particular sample characteristics with a charged particle beam having beam characteristics.

16. The method of claim 1, further comprising receiving an input of one or more of a geometry of the sample, a composition of the materials in the sample, a protocol for creating the sample, a slice thickness of layers in the sample, or a combination thereof, and wherein the first yield value and the second yield value are determined based on the input.

17. A charged particle microscope system, the system comprising:
- a sample holder configured to hold a sample;
- an electron beam source configured to emit an electron beam toward the sample;
- an electron beam column configured to direct the electron beam onto the sample;
  - a delayering component configured to remove a layer from the surface of the sample, the layer having a known thickness; one or more detectors configured to detect emissions resultant from the electron beam irradiating the sample;
  - one or more processors; and
  - a memory storing instructions that when executed on the one or more processors causes the charged particle microscope system to:
- acquire first data relating to a first layer of a sample, the first data having been acquired by a first irradiation of the first layer of the sample with a charged particle beam;
- acquire second data relating to a second layer of the sample, the second data having been acquired by a second irradiation of the second layer of the sample with the charged particle beam, wherein:
  - the first layer of the sample is removed between the first irradiation and the second irradiation; and
  - an electron interaction depth of the charged particle beam is larger than both the thickness of the first layer and the thickness of the second layer;
- access a simulated model that identifies a first yield value and a second yield value, wherein:
  - the first yield value corresponds to both a first expected amount of the first data that is attributable to emission from the first layer of the sample, and a second expected amount of the second data that is attributable to emission from the second layer of the sample; and
  - the second yield value corresponds to a third expected amount of the first data that is attributable to emission from the second layer of the sample; and
- determine a first reconstruction of the first layer and a second reconstruction of the second layer based on the simulated model, the first data, and the second data.

18. The charged particle microscope system of claim 17, wherein the instructions further cause the charged particle microscope system to construct a 3D reconstruction of the sample using the first reconstruction and the second reconstruction.

19. The charged particle microscope system of claim 17, wherein determining the first reconstruction of the first layer corresponds to:
- using the first yield value to identify a first portion of the second data that was generated based on emissions from structures within the second layer;
- using the second yield value to identify a second portion of the first data that was generated based on emissions from structures within the second layer of the sample; and
- subtracting a fraction of the second data from the first data to generate the first reconstruction of the first layer, where the fraction is based on a ratio of the first and second yield values.

20. The charged particle microscope system of claim 17, wherein the simulated model comprises a plurality of yield values, individual yield values identifying a portion of emissions that are expected to be have been generated by material at a corresponding depth from the surface of the sample when the surface of the sample is irradiated.

* * * * *